United States Patent
Nikolov et al.

(10) Patent No.: US 7,382,169 B2
(45) Date of Patent: Jun. 3, 2008

(54) SYSTEMS AND METHODS FOR REDUCING STATIC PHASE ERROR

(75) Inventors: Ludmil Nikolov, Chippenham (GB); Harald Weller, Bristol (GB); Michael G. France, Portland, OR (US); Ji Zhao, Saratoga, CA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 0 days.

(21) Appl. No.: 11/332,986

(22) Filed: Jan. 17, 2006

(65) Prior Publication Data
US 2007/0164798 A1  Jul. 19, 2007

(51) Int. Cl.
*H03L 7/06* (2006.01)
(52) U.S. Cl. .................................... 327/156; 327/147
(58) Field of Classification Search .................. None
See application file for complete search history.

(56) References Cited

U.S. PATENT DOCUMENTS

| | | | |
|---|---|---|---|
| 5,345,188 A | 9/1994 | Owen | |
| 5,939,947 A * | 8/1999 | Nakao et al. | 331/11 |
| 6,563,387 B2 * | 5/2003 | Hirano et al. | 331/11 |
| 6,693,494 B2 * | 2/2004 | Fan | 331/17 |
| 6,700,446 B2 * | 3/2004 | Ke | 331/1 A |
| 6,710,665 B2 | 3/2004 | Maneatis | |
| 7,038,508 B2 * | 5/2006 | Parker et al. | 327/156 |

OTHER PUBLICATIONS

International Search Report and Written Opinion of International Search Authority regarding PCT/US07/60541, which claims priority to U.S. Appl. No. 11/332,986, Oct. 16, 2007.

* cited by examiner

*Primary Examiner*—Cassandra Cox
(74) *Attorney, Agent, or Firm*—MacPherson Kwok Chen & Heid LLP

(57) ABSTRACT

In accordance with one or more embodiments of the present invention, a system includes a phase-locked loop circuit that receives a reference signal and a feedback signal and provides an output signal. A control circuit also receives the reference signal and the feedback signal and provides a correction current for the phase-locked loop circuit to reduce a phase error of the output signal.

18 Claims, 1 Drawing Sheet

SYSTEMS AND METHODS FOR REDUCING STATIC PHASE ERROR

TECHNICAL FIELD

The present invention relates generally to electrical circuits and, more particularly, for example to phase-locked loop circuits.

BACKGROUND

A phase-locked loop (PLL) is typically characterized by a certain, non-zero phase error (also referred to herein as phase offset or propagation delay (TPD)), which represents a phase difference between a reference clock input and a feedback clock input when the PLL is in a locked state. This phase difference, for example, may be caused by non-idealities and mismatches in circuit elements both within and outside of the PLL. The control of the phase error or phase difference is often one of the primary objectives in every PLL design (e.g., a phase difference less than a few hundred picoseconds may be desired).

A common approach for maintaining a low phase error is to design the PLL's charge pump so as to reduce its susceptibility to the various factors causing systematic and random mismatch in the output currents of the charge pump. For example, various circuit implementations exist that are known to improve the insensitivity of the charge pump currents to supply voltage variation, output voltage range, and device mismatch. However, these circuit implementations generally provide an optimal result for just a certain set of conditions (e.g., process, supply voltage, or output voltage/current) and charge pump architecture.

Another drawback to this approach is that these solutions generally do not provide active compensation for the current mismatch in the charge pump, which is translated into a charge difference in a loop filter of the PLL and consequently a timing difference or a phase error on the PLL input. Thus, these general approaches, for example, only offer an improvement that may be insufficient to meet the tight phase error specifications of current clock generator products. As a result, there is a need for improved PLL circuit techniques.

SUMMARY

In accordance with one embodiment of the present invention, a system includes a phase-locked loop circuit adapted to receive a reference signal and a feedback signal and provide an output signal; and a control circuit responsive to the reference signal and the feedback signal and adapted to modify a loop filter current of a loop filter within the phase-locked loop circuit to reduce a phase error of the output signal.

In accordance with another embodiment of the present invention, an integrated circuit includes a phase-locked loop adapted to receive a reference signal and a feedback signal and provide a phase-locked loop output signal; and means responsive to the reference signal and the feedback signal for providing a correction current to the phase-locked loop to reduce a phase error of the phase-locked loop output signal.

In accordance with another embodiment of the present invention, a method of reducing a phase error of a phase-locked loop output signal from a phase-locked loop circuit includes receiving by the phase-locked loop circuit a reference signal and a feedback signal; providing the phase-locked loop output signal, from the phase-locked loop circuit, based on the reference signal and the feedback signal; determining a value of a correction current based on the reference signal and the feedback signal; and providing the correction current, based on the determining, to the phase-locked loop circuit to reduce a phase error of the phase-locked loop output signal.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

Figure 1:
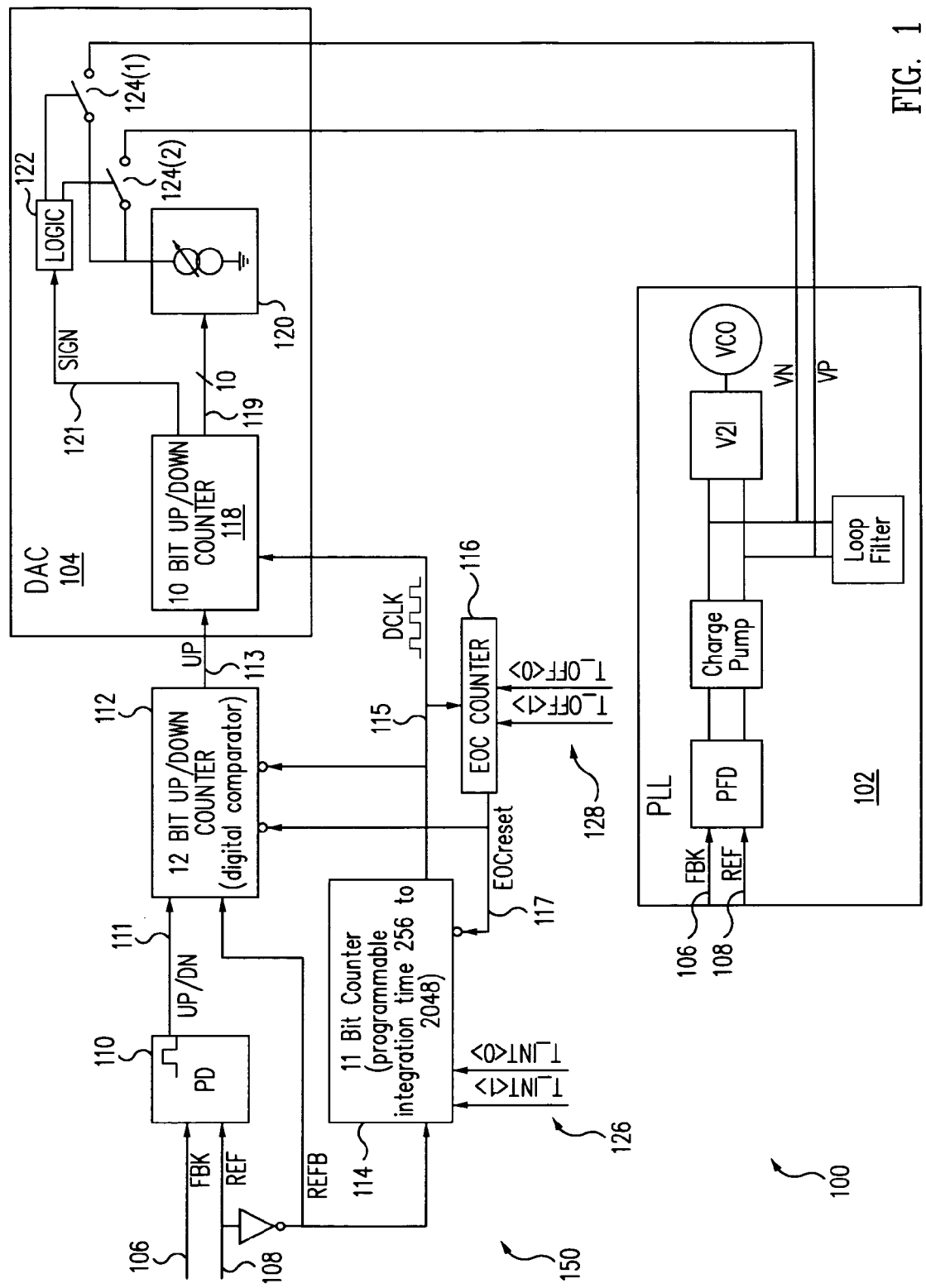
FIG. 1 shows a block diagram illustrating a phase-locked loop circuit and associated control circuitry in accordance with an embodiment of the present invention.

FIG. 1 shows a block diagram of an exemplary circuit 100, which illustrates a phase-locked loop circuit and associated control circuitry in accordance with an embodiment of the present invention. Circuit 100 includes a PLL 102 and a control circuit 150, which includes a phase detector (PD) 110, counters 112, 114, and 116, and a digital-to-analog converter (DAC) 104. In general, circuit 100 illustrates an exemplary implementation for PLL 102 and associated control circuit 150, which is also referred to herein as a zero delay control circuit and may be viewed as operating functionally to some extent as a second phase detector or a portion of a PLL within circuit 100.

PD 110 may be implemented, for example, as a fast lead-lag detector capable of resolving a small phase difference (e.g., 35 pS) between a feedback clock (FBK) 106 and a reference clock (REF) 108 (the two clock inputs to PD 110 and PLL 102). When reference clock 108 is leading feedback clock 106, an output signal (UP/DN) 111 is set to a logical high value. When reference clock 108 is lagging feedback clock 106, output signal 111 is set or reset to a logical low value.

Counter 114 may be implemented as an integration time counter (e.g., an 11 bit counter having a programmable integration time from 256 to 2,048). As noted, control circuit 150 may be viewed as functioning as a second phase detector (or portion of a PLL), but its gain generally should be much less than PLL 102 (the main PLL) to provide smooth compensation and not introduce abrupt changes in the generated frequency of PLL 102. Consequently, control circuit 150 uses a clock (DCLK) 115 provided by counter 114 that is slower (e.g., 256 to 2,048 times slower) than reference clock 108 so that control circuit 150 (the additional loop) does not disturb the stability of PLL 102 (the main loop).

In general, as the optimal speed depends on the particular settings of PLL 102, the frequency of clock 115 may be made programmable or selectable (e.g., controlled by hardware or software). As an example, counter 114, which may be implemented as a synchronous counter with a programmable division ratio, may be controlled as illustrated in Table 1 (for exemplary values) to select the desired integration period by control signals 126 (labeled T_INT). For example, if circuit 100 is implemented within a programmable device (e.g., a programmable clock generator or a programmable zero delay buffer), the frequency of clock 115 may be programmed by using the conventional software for programming such devices (e.g., programmable analog circuit (PAC) designer software by Lattice Semiconductor Corporation®).

TABLE 1

| T_INT [1] | T_INT [0] | Division Ratio |
|---|---|---|
| 0 | 0 | 256 |
| 0 | 1 | 512 |
| 1 | 0 | 1024 |
| 1 | 1 | 2048 |

PD 110 (also referred to herein as the zero delay control phase detector) registers the sign of the phase error for every period of reference clock 108. This information is later stored and processed (e.g., averaged over the entire integration/comparison period) by counter 112 (e.g., providing digital comparator functionality). Counter 112, for example, may be implemented as a 12-bit up-down counter clocked with the inverse of reference clock 108 and reset at the end of each integration period by clock 115. The counting direction is controlled by output signal 111 of PD 110. For example, if output signal 111 is a logical high value (a "1" or HIGH), the counter value of counter 112 will be incremented, while if output signal 111 is a logical low value (a "0" or LOW), the counter value of counter 112 will be decremented.

For example, in accordance with an embodiment of the present invention, counter 112 is initially preset to 800(Hex) (i.e., the MSB is set to 1). If within one integration period output signal 111 of PD 110 provides a HIGH more often than a LOW, then there are more up counts than down counts and at the end of the integration period the MSB of counter 112 remains at 1. When output signal 111 of PD 110 provides a LOW more often than a HIGH, then there are more down counts than up counts and at the end of the integration period the MSB of counter 112 changes to 0.

The final state of an output signal (UP) 113 provided by counter 112 is determined by the state of the MSB, read at the end of each integration period or cycle, just before counter 112 is preset back to 800(Hex). Output signal 113 is used to control the count direction for a counter 118 (e.g., a 10 bit up/down counter) within DAC 104.

The number of bits and the range of DAC 104 (e.g., a 10-bit current DAC) are determined by the expected maximum phase delay of PLL 102 (i.e., the main loop) and the desired resolution of control circuit 150 (i.e., the control loop). For this particular exemplary implementation, in accordance with an embodiment of the present invention, an exemplary 10-bit current DAC for DAC 104 is illustrated, but this is not limiting and any desired number of bits and range for DAC 104 may be implemented.

The output current of DAC 104 is set by counter 118 (e.g., a 10-bit up down counter). For example, for every clock cycle of clock 115 (i.e., the integration clock cycle (DCLK)), the content of counter 118 is either incremented or decremented by one, depending on the state of output signal 113 from counter 112 (i.e., the direction of output signal (UP) 113 provided as an input to counter 118).

Output signal 113 is also used to define a sign signal 121 (the internal SIGN signal of DAC 104), which is provided to logic 122. For example, counter 118 latches output signal 113 into a dedicated register (e.g., every clock cycle of clock 115 or when counter 118 reaches an 'all-zero' state) to provide a value for sign signal 121 (i.e., forms the SIGN bit). Depending on the state of SIGN signal 121, a current source 120 (i.e., the correction current source provided by DAC 104) is selectively connected by logic 122 via switches 124 to one of the loop filter nodes (labeled VN and VP), as shown, within PLL 102 to sink current from PLL 102.

For example, when sign signal 121 provides a logical high signal (the SIGN bit equals "1"), switch 124 (2) is closed to sink current from the loop filter node Vn (i.e., the negative node), thus increasing a differential voltage ($V_{diff}$) to increase the VCO frequency of PLL 102. When sign signal 121 provides a logical low signal (the SIGN bit equals "0"), switch 124 (1) is closed to sink current from the loop filter node Vp (i.e., the positive node), thus decreasing the differential voltage ($V_{diff}$) to decrease the VCO frequency of PLL 102. The amount of current sunk by current source 120 is controlled by an output signal 119 from counter 118 (e.g., providing a 10-bit digital word). For example, each increment/decrement of counter 118 changes a value of the current by one step (i.e., one LSB), resulting in a very small change in the control voltage and negligible jitter.

An optional feature that can keep the jitter level low is the dead band of counter 118 that prevents the output current from wandering back and forth (i.e., ±LSB) when the average phase error is close to zero. For example, the 10-bit digital word provided by counter 118 via output signal 119 may be incremented or decremented only if output signal 113 (the UP signal) stayed High or Low, respectively, for a given number of consecutive integration (comparison) periods (e.g., for two periods of clock 115). Furthermore, the performance may optionally be improved by making the number of required consecutive integration periods programmable (e.g., 2, 4, or 8) and controlled by hardware or software (e.g., PAC designer software).

By default, control circuit 150 (the zero delay control circuit) runs continuously to reduce the phase error, thus effectively compensating for various effects that may cause the phase error (e.g., temperature and supply variations). However, counter 116 may be provided to function as an end of correction (EOC) logic block (i.e., EOC signal generator) to switch off control circuit 150 after a certain period of time to completely eliminate any potential impact that control circuit 150 might have on the jitter performance of PLL 102.

As an example, the switch off time may be programmable and controlled by hardware or software (e.g., the PAC Designer software). For example, the switch off time may be set to 512, 1,024, or 2,048 periods of clock 115 (the integration/comparison clock) by control signals 128 (labeled T_OFF), as further illustrated in Table 2 (for exemplary values).

Counter 116 (EOC counter) may be implemented, for example, as a 10-bit asynchronous counter with a programmable division ratio to generate a control signal 117 (labeled $EOC_{reset}$) to provide the EOC signal. When asserted, control signal 117 (the EOC signal) disables all clock signals in control circuit 150 (e.g., clock 115) and control circuit 150 is placed in a reset or power down state. However, DAC 104 may continue to store in its registers the latest correction code, which determines the proper correction current of current source 120.

TABLE 2

| T_OFF [1] | T_OFF [0] | Division Ratio |
|---|---|---|
| 0 | 0 | N/A (Continuous) |
| 0 | 1 | 512 |
| 1 | 0 | 1024 |
| 1 | 1 | 2048 |

In general, control circuit 150 functions to reduce the static phase error of PLL 102, while maintaining system stability and minimizing its impact on jitter of PLL 102. In this regard, various features of circuit 100 may be optimized to increase performance or minimize any undesirable effects. For example, control circuit 150 may be synchronized with the falling edge of reference clock 108 to minimize its impact on the jitter of PLL 102. Additionally, the phase delay or error compensation may begin only after PLL 102 is in a locked state and, at the end of each integration/comparison cycle (i.e., after each cycle of clock 115), DAC 104 may change the correction current of current source 120 by only one LSB.

Control circuit 150 (i.e., the zero delay control circuit), as noted herein, may be viewed as a second phase detector or a portion of a PLL that operates in parallel with PLL 102 (the main PLL). Typically, for a conventional PLL system to maintain a constant output frequency (i.e., to be in locked state), it has been determined that the PLL generates a correction charge ($\Delta Q_{corr}$) on every rising edge of its input reference clock as illustrated in an exemplary fashion by equation (1)

$$\Delta Q_{corr} = (TPD)(I_{CHP}) \qquad (1)$$

where the TPD is the phase delay and $I_{CHP}$ is the charge pump output current.

In accordance with one or more embodiments of the present invention, the zero delay control techniques disclosed herein may be viewed as being based on a similar compensation principle. For example, current source 120 of DAC 104 (implemented as a 10-bit current DAC) provides a digitally controlled current source (referred to herein as $I_{CORR}$ for correction current), which is used to sink current from either the negative or the positive loop filter node of PLL 102. Consequently, the differential VCO voltage and thus the frequency of PLL 102 are being increased or decreased.

The resolution and the range of DAC 104 may be determined from the measured/simulated phase offset of PLL 102 (e.g., the number of bits for DAC 104 may be based on the amount of bits needed to cover the full range of the correction current $I_{CORR}$). Furthermore, in accordance with an embodiment of the present invention, the switching noise and induced jitter may be reduced by permanently coupling DAC 104 to the loop filter nodes of PLL 102 (e.g., correction current $I_{CORR}$ is applied for the whole period of reference clock 108).

In general, control circuit 150 (the PLL zero delay control circuit) continuously monitors the two input clocks (feedback clock 106 and reference clock 108) of PLL 102 and measures the sign of the phase error to determine the corrective action required. For example, a correction current may be sourced or sinked into or out of the loop filter of PLL 102 to generate a compensation charge on at least one of the loop filter nodes.

In accordance with an embodiment of the present invention, the monitoring, decision making, and control portions of control circuit 150 may be implemented as digital elements, which may allow a straightforward implementation and provide the capability to port across different technologies. Furthermore, a digital implementation may provide a high level of insensitivity to variations and mismatches as well as the ability to easily reconfigure and customize. Additionally, by employing integration as one of the principles of operation ensures that the errors and/or inaccuracies in any analog portion (e.g., current source 120 that generates the correction current) has little impact on the overall accuracy of the system.

Systems and methods are disclosed herein to provide improved PLL techniques. For example, in accordance with an embodiment of the present invention, a circuit is disclosed that reduces PLL phase delays (e.g., reducing a 1.5 nS phase error to 100 to 150 pS). The circuit targets the PLL charge pump, which is often one of the main contributors to the phase error, and provides a dynamic compensation for the process and temperature variations as well as the systematic and random mismatches in the current output stage of the charge pump.

The circuit, for example, may also compensate for any errors related to the generation and distribution of the control signals for the PLL charge pump (e.g., the UP and DOWN signals generated by the phase frequency detector (PFD)). The circuit (e.g., zero delay control circuit) is able to work equally well with different PLL charge pump architectures and the basic compensation principle is applicable to many different types of PFDs (e.g., passive-type loop filters and single ended or differential PLL structures).

The circuit may incorporate programmable features, as discussed herein, to provide desirable functionality or flexibility in design. For example, the circuit may be controlled by software or hardware to set, program, or control various variable functions of the circuit. Thus, the circuit may be implemented, as an example, within a programmable device. However, it should be understood that programmability is not required to implement one or more embodiments of the present invention.

Embodiments described above illustrate but do not limit the invention. It should also be understood that numerous modifications and variations are possible in accordance with the principles of the present invention. Accordingly, the scope of the invention is defined only by the following claims.

What is claimed is:

1. A system comprising:
    a phase-locked loop circuit adapted to receive a reference signal and a feedback signal and provide an output signal; and
    a control circuit responsive to the reference signal and the feedback signal and adapted to modify a loop filter current of a loop filter within the phase-locked loop circuit to reduce a phase error of the output signal, the control circuit comprising:
        a phase detector adapted to receive the reference signal and the feedback signal and provide a phase detector output signal;
        a first counter adapted to receive the phase detector output signal and provide a first counter output signal based on the phase detector output signal; and
        a digital-to-analog converter adapted to receive the first counter output signal and modify the loop filter current of the loop filter based on the first counter output signal;
    wherein the control circuit is adapted to modify the loop filter current by at least one of providing a current to and receiving a current from at least one of a positive node and a negative node of the loop filter.

2. The system of claim 1, wherein a frequency of the modifications to the loop filter current is programmable by selecting a desired number of successive integration cycles.

3. The system of claim 1, wherein the control circuit further comprises a second counter adapted to receive the reference signal and provide a control circuit clock having a lower frequency than a frequency of the reference signal, wherein the first counter and the digital-to-analog converter are clocked by the control circuit clock.

4. The system of claim 3, wherein the control circuit further comprises a third counter adapted to receive the control circuit clock and provide an end of correction signal after a certain time period to stop further modifications to the loop filter current of the loop filter by the control circuit.

5. The system of claim 1, wherein the digital-to-analog converter comprises:
a current source adapted to generate a first current;
a second counter adapted to receive the first counter output signal and control a value of the first current of the current source based on the first counter output signal, wherein the first current is used to modify the loop filter current to reduce the phase error of the output signal of the phase-locked loop circuit.

6. The system of claim 1, wherein the system is within a programmable device, wherein the control circuit is further adapted to modify the loop filter current of the loop filter at a programmable frequency.

7. The system of claim 1, wherein the control circuit sinks a current from the positive node or the negative node of the loop filter to modify the loop filter current.

8. A system comprising:
a phase-locked loop circuit adapted to receive a reference signal and a feedback signal and provide an output signal; and
a control circuit responsive to the reference signal and the feedback signal and adapted to modify a loon filter current of a loop filter within the phase-locked loop circuit to reduce a phase error of the output signal;
wherein the control circuit is adapted to modify the loop filter current by at least one of providing a current to and receiving a current from at least one of a positive node and a negative node of the loop filter and is further adapted to synchronize the modified loop filter current to a falling edge of the reference signal after the phase-locked loop circuit achieves a locked state.

9. A method of reducing a phase error of a phase-locked loop output signal from a phase-locked loon circuit, the method comprising:
receiving by the phase-locked loop circuit a reference signal and a feedback signal;
providing the phase-locked loop output signal, from the phase-locked loop circuit, based on the reference signal and the feedback signal;
determining a value of a correction current based on the reference signal and the feedback signal;
providing the correction current, based on the determining, to the phase-locked loop circuit to reduce a phase error of the phase-locked loop output signal, wherein the providing of the correction current comprises sinking the value of the correction current from a positive or a negative node of a loop filter of the phase-locked loon circuit; and
synchronizing the providing of the correction current to a falling edge of the reference signal after the phase-locked loop circuit achieves a locked state.

10. An integrated circuit comprising:
a phase-locked loop adapted to receive a reference signal and a feedback signal and provide a phase-locked loop output signal;
means responsive to the reference signal and the feedback signal for providing a correction current to the phase-locked loop to reduce a phase error of the phase-locked loop output signal; and
means for generating a clock signal for the providing means, wherein a frequency of the clock signal is less than a frequency of the reference signal.

11. The integrated circuit of claim 10, wherein the integrated circuit comprises a programmable device.

12. The integrated circuit of claim 10, wherein the frequency of the clock signal is programmable.

13. The integrated circuit of claim 10, further comprising means for preventing, after a certain time period, further changes to a value of the correction current, wherein the time period is programmable.

14. The integrated circuit of claim 10, wherein a frequency of changes to a value of the correction current is programmable.

15. The integrated circuit of claim 10, wherein the correction current is drawn from a positive or a negative node of a loop filter of the phase-locked loop.

16. The integrated circuit of claim 10, wherein the providing means is synchronized to a falling edge of the reference signal and performed after the phase-locked loop achieves a locked state.

17. A method of reducing a phase error of a phase-locked loop output signal from a phase-locked loop circuit, the method comprising:
receiving by the phase-locked loop circuit a reference signal and a feedback signal;
providing the phase-locked loop output signal, from the phase-locked loop circuit, based on the reference signal and the feedback signal;
determining a value of a correction current based on the reference signal and the feedback signal;
providing the correction current, based on the determining, to the phase-locked loop circuit to reduce a phase error of the phase-locked loop output signal, wherein the providing of the correction current comprises sinking the value of the correction current from a positive or a negative node of a loop filter of the phase-locked loop circuit; and
preventing, after a programmable time period; further changes to the value of the correction current, and wherein a frequency of changes to the correction current is programmable.

18. A method of reducing a phase error of a phase-locked loop output signal from a phase-locked loop circuit, the method comprising:
receiving by the phase-locked loop circuit a reference signal and a feedback signal;
providing the phase-locked loop output signal, from the phase-locked loop circuit, based on the reference signal and the feedback signal;
determining a value of a correction current based on the reference signal and the feedback signal;

providing the correction current, based on the determining, to the phase-locked loop circuit to reduce a phase error of the phase-locked loop output signal, wherein the providing of the correction current comprises sinking the value of the correction current from a positive or a negative node of a loop filter of the phase-locked loop circuit; and generating a programmable clock signal for the determining and the providing of the correction current, wherein a frequency of the clock signal is less than a frequency of the reference signal.

* * * * *

UNITED STATES PATENT AND TRADEMARK OFFICE
CERTIFICATE OF CORRECTION

PATENT NO. : 7,382,169 B2
APPLICATION NO. : 11/332986
DATED : June 3, 2008
INVENTOR(S) : Ludmil Nikolov et al.

Page 1 of 1

It is certified that error appears in the above-identified patent and that said Letters Patent is hereby corrected as shown below:

Col. 7, line 37/38 (claim 8): "a control circuit responsive to the reference signal and the feedback signal and adapted to modify a loon filter" should read --"a control circuit responsive to the reference signal and the feedback signal and adapted to modify a loop filter--

Col. 7, line 48/49 (claim 9): "A method of reducing a phase error of a phase-locked loop output signal from a phase-locked loon circuit," should read --A method of reducing a phase error of a phase-locked loop output signal from a phase-locked loop circuit,--

Col. 7, line 63/64 (claim 9): "or a negative node of a loop filter of the phase-locked loon circuit;" should read --or a negative node of a loop filter of the phase-locked loop circuit;--

Signed and Sealed this

Nineteenth Day of May, 2009

JOHN DOLL
*Acting Director of the United States Patent and Trademark Office*